(12) United States Patent
Kawaguchi et al.

(10) Patent No.: US 9,910,428 B2
(45) Date of Patent: Mar. 6, 2018

(54) ELECTRONIC COMPONENT MOUNTING DEVICE, ELECTRONIC COMPONENT MOUNTING SYSTEM, AND METHOD FOR MODIFYING SETTING INFORMATION IN ELECTRONIC COMPONENT MOUNTING DEVICE AND ELECTRONIC COMPONENT MOUNTING SYSTEM

(71) Applicant: Panasonic Corporation, Osaka (JP)

(72) Inventors: Satoshi Kawaguchi, Yamanashi (JP); Shigekazu Yoneyama, Yamanashi (JP); Tatsuo Yamamura, Fukuoka (JP); Kazunori Kanai, Yamanashi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 644 days.

(21) Appl. No.: 14/381,340

(22) PCT Filed: Feb. 26, 2013

(86) PCT No.: PCT/JP2013/001124
§ 371 (c)(1),
(2) Date: Aug. 27, 2014

(87) PCT Pub. No.: WO2013/153730
PCT Pub. Date: Oct. 17, 2013

(65) Prior Publication Data
US 2015/0045938 A1    Feb. 12, 2015

(30) Foreign Application Priority Data

Apr. 13, 2012    (JP) .................................. 2012-091576

(51) Int. Cl.
*G06F 19/00* (2011.01)
*G05B 19/418* (2006.01)
*H05K 13/04* (2006.01)

(52) U.S. Cl.
CPC ... *G05B 19/41865* (2013.01); *H05K 13/0417* (2013.01); *G05B 2219/50386* (2013.01)

(58) Field of Classification Search
None
See application file for complete search history.

(56) References Cited

U.S. PATENT DOCUMENTS

| 2001/0049876 A1 | 12/2001 | Yoshida et al. |
| 2003/0072644 A1 | 4/2003 | Yamamura et al. |

(Continued)

FOREIGN PATENT DOCUMENTS

| CN | 1216673 A | 5/1999 |
| CN | 1413079 A | 4/2003 |

(Continued)

OTHER PUBLICATIONS

Chinese Search Report for Application No. 201380012695.9 dated May 4, 2016.

(Continued)

*Primary Examiner* — Wissam Rashid
(74) *Attorney, Agent, or Firm* — Pearne & Gordon LLP

(57) ABSTRACT

Each of a plurality of tape feeders arranged in a component feed section includes a display part which displays setting information stored in a feeder storage part, an operation input part which displays the setting information in the display part and a modification process part which outputs a signal for modifying the setting information stored in a main body storage part and the feeder storage part in accordance with an input of a modification operation. The modification (Continued)

operation of the setting information can be carried out in a flexible form and with a good working property.

7 Claims, 9 Drawing Sheets

(56) References Cited

U.S. PATENT DOCUMENTS

2005/0160593 A1    7/2005  Yamamura et al.
2005/0210664 A1*   9/2005  Kitajima ............ H05K 13/0417
                                                              29/739

FOREIGN PATENT DOCUMENTS

| JP | 04-297100 A | 10/1992 |
| JP | 07-038285 A | 2/1995 |
| JP | 2007-242757 A | 9/2007 |
| JP | 2010-087305 A | 4/2010 |
| JP | 2010-219107 A | 9/2010 |

OTHER PUBLICATIONS

Chinese Office Action for Application No. 201380012695.9 dated May 4, 2016.
International Search Report issued in Application No. PCT/JP2013/001124 dated Apr. 16, 2013.

* cited by examiner

ELECTRONIC COMPONENT MOUNTING DEVICE, ELECTRONIC COMPONENT MOUNTING SYSTEM, AND METHOD FOR MODIFYING SETTING INFORMATION IN ELECTRONIC COMPONENT MOUNTING DEVICE AND ELECTRONIC COMPONENT MOUNTING SYSTEM

TECHNICAL FIELD

The present invention relates to an electronic component mounting device which mounts electronic component on a board and a method for modifying setting information which modifies setting information of a component feeding operation or a component taking out information in the electronic component mounting device.

BACKGROUND ART

In a component supply part provided in an electronic component mounting device which mounts electronic component on a board, a tape feeder provided with a component feed mechanism which conveys the electronic component held by a carrier tape to a taking out position by a component mounting mechanism is arranged for each of kinds of component (for instance, see patent literature 1). In the tape feeder, since operation parameters such as a feed speed or a feed pitch when the carrier tape is fed pitch by pitch are different respectively depending on the kinds of the component, the operation parameters are stored not only in a feeder storage part provided in the tape feeder, but also, as component library information, in a main body storage part of an electronic component mounting device main body or a system storage part of a host computer which generalizes an electronic component mounting system formed by connecting a plurality of devices together. Then, when a kind of production machine is switched to change the kind of the component as an object to be mounted during an operating process of the electronic component mounting system, the operation parameters of the kind of the component read from the component library information are written respectively in the feeder storage parts of the tape feeders.

The electronic component used in a production spot of a mounting board have the same standard for the kind of the component; however, provisions of items relating to the operation parameters for operating the tape feeder such as a material of the carrier tape for holding the component or a component arrangement pitch may be occasionally different. In such a case, in order to normally operate the tape feeder, the operation parameters which are already stored in accordance with the component library information need to be modified so as to be adapted to actually used electronic component. The above-described reference or modification of the already set operation parameters is usually carried out through a data display and input function provided in a host system such as the host computer.

In recent years, the function of a tape feeder single body is made to be high and the tape feeder is used that has a structure provided with an individual display function. For instance, in an example disclosed in patent literature 1, a seven-segment type display device is provided in an operation side by an operator in a tape feeder so that the number of remaining component of the tape feeder or error codes showing contents of occurring errors may be displayed.

LITERATURE OF RELATED ART

Patent Literature

Patent Literature 1: JP-A-2007-242757

SUMMARY OF THE INVENTION

Problems that the Invention is to Solve

When the tape feeder is used which has a highly advanced function and a progressive intelligence in view of a control as described above, the individual tape feeders are desired to carry out more versatile operations including the above-described reference or modification of the setting information such as the already set operation parameters. However, in the usual technique including the example of the above-described patent literature, when an operation that the setting information set by the host system or written respectively in the tape feeders is to be referred to for a recognition or modified as required, the data display and input function provided in the host system needs to be used. Thus, a method inferior in working property is forced to be used that the recognition of the actually used tape feeder and the input of an operation are respectively separately carried out at remote positions.

Further, the modification of such setting information does not necessarily have contents to be applied to all the tape feeders used in one device, but the setting information may be sometimes desired to be temporarily modified for a part of the tape feeders. However, in the usual technique, when the modification operation is carried out by the host system, the modification is applied to all the same kinds of devices. Accordingly, for instance, when the modification is desired to be applied only to a part of the devices, the modification operation is hardly carried out in a flexible form.

Thus, it is an object of the present invention to provide an electronic component mounting device and a method for modifying setting information in the electronic component mounting device which can carry out a modification operation of the setting information in a flexible form and with a good working property.

Solution to Problem

According to an aspect of the invention, there is provided an electronic component mounting device having a component feed section to which a tape feeder is attached for feeding a carrier tape holding electronic components pitch by pitch to mount the electronic component on a board, the electronic component mounting device including:

a component mounting mechanism which takes out the electronic components from the tape feeder to move and mount the electronic components on the board;

a main body control part which controls the component mounting mechanism and a main body storage part which stores information used in a control process by the main body control part, wherein the tape feeder includes a feeder control part which controls the tape feeder, a feeder storage part which stores information used in a control process by the feeder control part, a display part which displays information relating to a tape feeding operation by the tape feeder and a component taking out operation from the tape feeder by the component mounting mechanism as setting information which is previously set and inputted and stored in the feeder storage part, an operation input part which carries out an input of a display operation for displaying the setting information in the display part and an input of a modification operation for modifying the displayed setting information, and a modification process part which outputs a signal for modifying the setting information stored in the main body storage part and the feeder storage part in accordance with the input of the modification operation.

According to another aspect of the invention, there is provided a method for modifying setting information in an electronic component mounting device, including a component mounting mechanism which takes out an electronic component from a tape feeder to move and mount the electronic component on a board, a main body control part which controls the component mounting mechanism, and a main body storage part which stores information used in a control process by the main body control part, to take out the electronic component from a component feed section to which the tape feeder is attached for feeding a carrier tape holding the electronic component pitch by pitch and mount the electronic component on the board, the method for modifying setting information that modifies information relating to a tape feeding operation by the tape feeder and a component taking out operation from the tape feeder by the component mounting mechanism as previously set and inputted setting information includes:

a display process that a display operation is inputted by an operation input part in the tape feeder to display the setting information stored in a feeder storage part in a display part arranged in the tape feeder; and a modification process that a modification of a display is inputted by the operation input part to output a signal for modifying the setting information.

Advantage of the Invention

According to the present invention, each of the plurality of tape feeders arranged in the component feed section includes the display part which displays the information relating to the tape feeding operation by the tape feeder and the component taking out operation from the tape feeder by the component mounting mechanism as the setting information which is previously set and inputted and stored in the feeder storage part, the operation input part which carries out an input of the display operation for displaying the setting information in the display part and an input of the modification operation for modifying the displayed setting information and the modification process part which outputs the signal for modifying the setting information stored in the main body storage part and the feeder storage part in accordance with the input of the modification operation. Thus, the modification operation of the setting information can be carried out in a flexible form and with a good working property.

MODE FOR CARRYING OUT THE INVENTION

Figure 1:
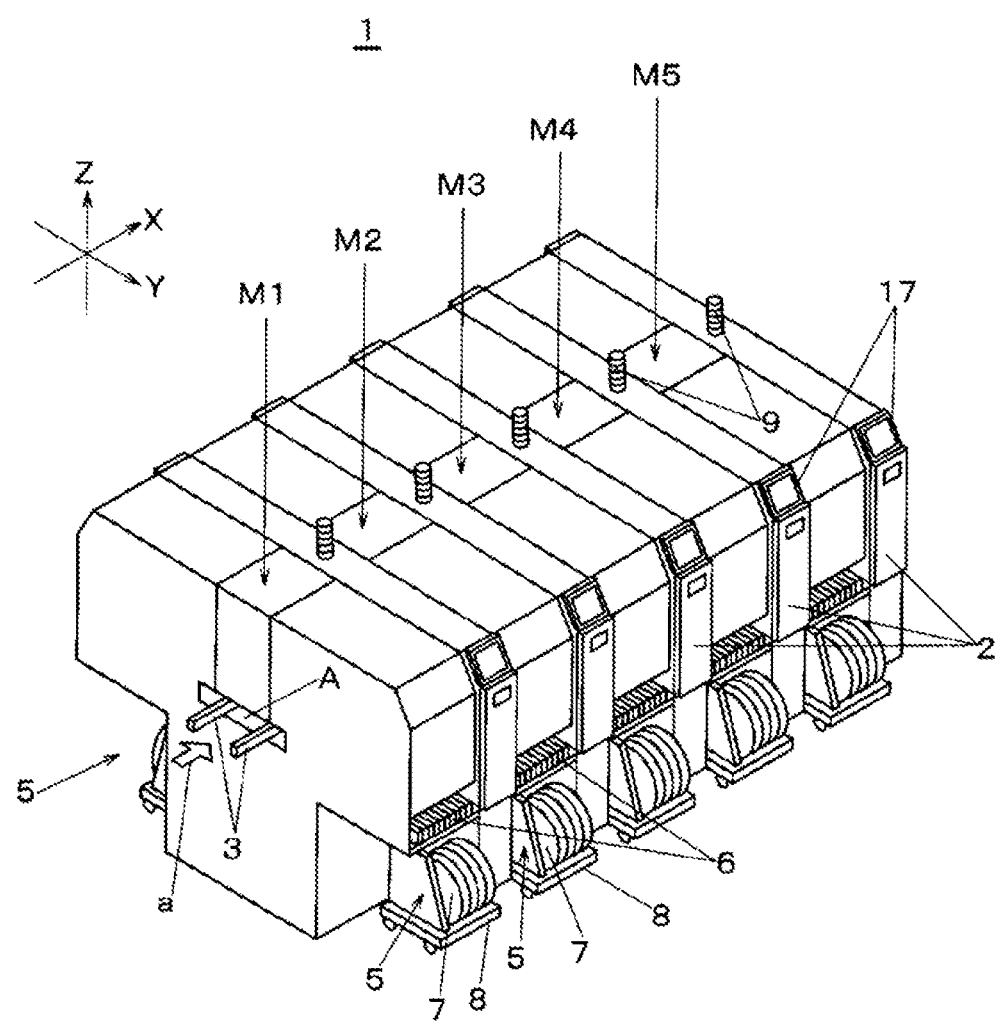
FIG. 1 is a perspective view of an electronic component mounting system using an electronic component mounting device of one exemplary embodiment of the present invention.

Now, an exemplary embodiment of the present invention will be described below by referring to the drawings. Initially, by referring to FIG. 1, a structure of an electronic component mounting system 1 will be described. The electronic component mounting system 1 includes a plurality of the same kinds of electronic component mounting devices (refer them simply as to "devices" in abbreviation, hereinafter) M1, M2, M3, M4 and M5 connected in series and has a function for mounting electronic component on a board to produce a mounting board. The board fed from an upstream side (an arrow mark a) to the electronic component mounting system 1 as an object to which the electronic component is mounted is delivered to a board conveying mechanism 3 through a conveying opening part A provided in the device M1 located in the most upstream side and sequentially conveyed in a direction X (a board conveying direction) in the electronic component mounting system 1. The loaded board serves as the object of component mounting operations respectively by the devices and the board after the component mounting operation is further unloaded to a device of a downstream side.

In the electronic component mounting system 1, in the device M1 to the device M5 respectively, are arranged operation parts 2 in which the devices are respectively operated by machine operators and component feed sections 5 for feeding the electronic component to the devices. To the component feed sections 5, carriages 8 are attached which hold a plurality of tape feeders 6 as component feeders for feeding the electronic component or tape reels 7 arranged in parallel. The tape feeder 6 feeds a carrier tape which holds the electronic component pitch by pitch to feed the electronic component to a below-described component mounting mechanism. The tape reel 7 winds and accommodates the carrier tape fed to the tape feeder 6.

Figure 2:
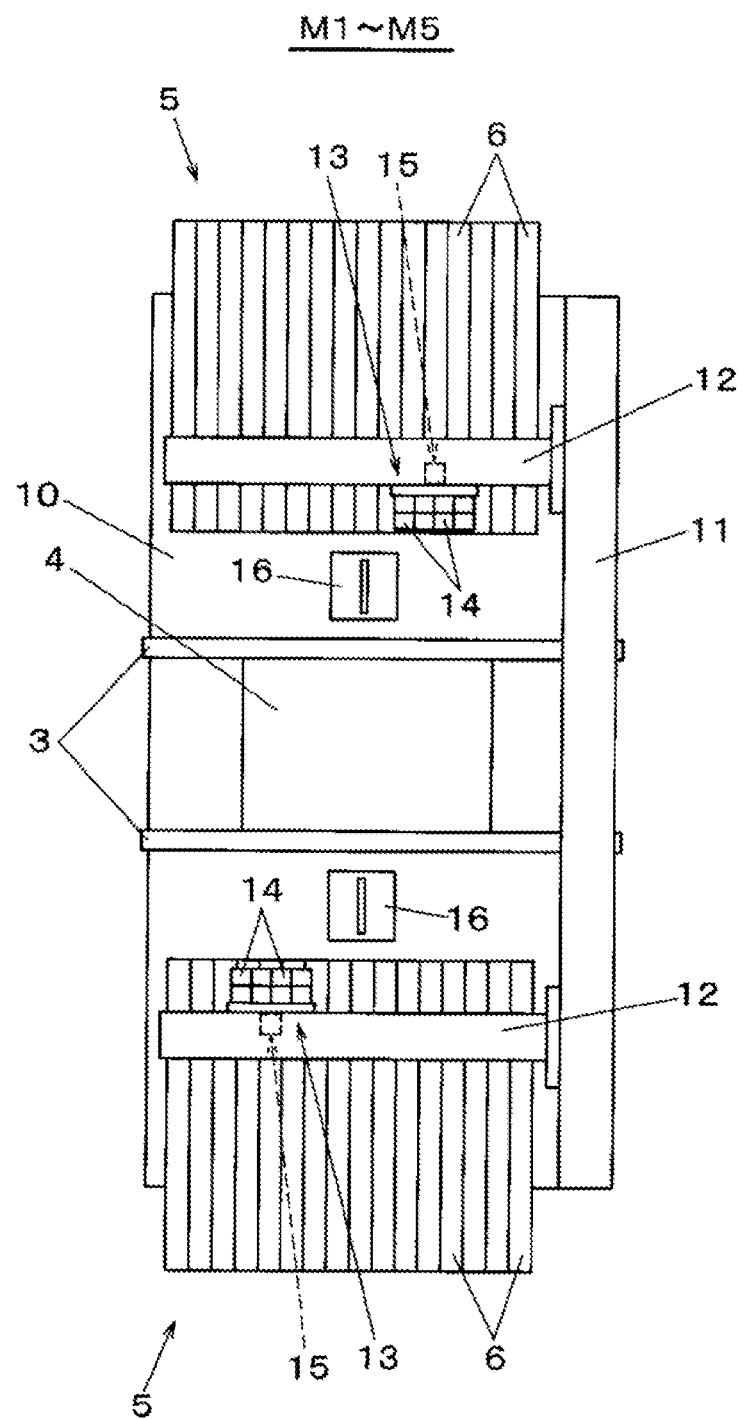
FIG. 2 is a plan view of the electronic component mounting device of the one exemplary embodiment of the present invention.

Now, structures of the device M1 to the device M5 will be described below by referring to FIG. 2. In FIG. 2, on a base 10, the board conveying mechanism 3 is arranged in the direction X. The board 4 which is fed from an upstream side device and serves as the object of the component mounting operations by the devices is conveyed by the board conveying mechanism 3 and positioned and held in a position of the component mounting operation. In both sides of the board conveying mechanism 3, the component feed sections 5 are provided. To the component feed sections 5, a plurality of tape feeders 6 are attached. In one end part of the base 10 in the direction X, a Y-axis moving table 11 provided with a linear driving mechanism is horizontally arranged in a direction Y. To the Y-axis moving table 11, X-axis moving tables 12 similarly provided with linear moving mechanisms are connected. To the X-axis moving tables 12, mounting heads 13 are respectively attached so as to be movable in the direction X.

The mounting head 13 is a multiple string type head having a plurality (here, eight) of unit mounting heads 14. The unit mounting heads 14 respectively suck and hold the electronic component by suction nozzles 14a (see FIG. 4) attached to lower end parts. The Y-axis moving table 11 and the X-axis moving tables 12 form a head moving mechanism. The head moving mechanism is driven so that the mounting heads 13 move in the direction X and in the direction Y. Thus, the unit mounting heads 14 respectively take out the electronic component from the tape feeders 6 of the component feed sections 5 to move and mount the electronic component on the board 4 positioned by the board conveying mechanism 3.

Accordingly, the Y-axis moving table 11, the first X-axis moving table 12 and the mounting head 13 serve as a component mounting mechanism 40 (see FIG. 7) which moves the mounting head 13 holding the electronic component by the head moving mechanism to move and mount the electronic component on the board 4. Between the component feed section 5 and the board conveying mechanism 3, a component recognition device 16 is arranged. When the mounting head 13 which takes out the electronic component from the component feed section 5 moves above the component recognition device 16, the component recognition device 16 picks up an image of the electronic component held by the mounting head 13 to recognize the electronic component.

To the mounting head 13, a board recognition camera 15 (see FIG. 4) is attached which is located in a lower surface side of the X-axis moving table 12 and moves integrally therewith. When the mounting head 13 moves, the board recognition camera 15 moves to an upper part of the board 4 positioned by the board conveying mechanism 3 to pick up an image of the board 4 and recognize the board 4. In a mounting operation of the electronic component on the board 4 by the mounting head 13, a mounting position is corrected by considering the recognized result of the electronic component of the component recognition device 16 and the board recognized result of the board recognition camera 15.

Figure 3:
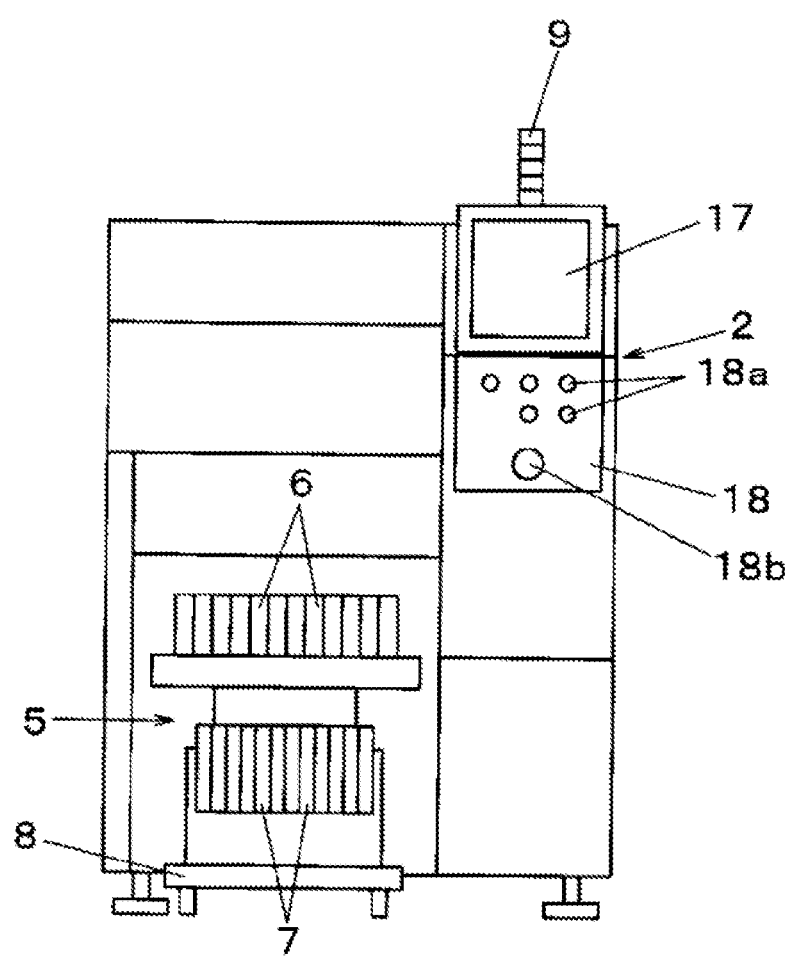
FIG. 3 is a front view of the electronic component mounting device of the one exemplary embodiment of the present invention.

Now, referring to FIG. 3, will be described arrangements of the parts respectively in operating surfaces of the device M1 to the device M5. In the operating surface, the operation part 2 is arranged in a vertical attitude in a side part of the component feed section 5. In an upper part of the operation part 2, a monitor 17 is arranged which is formed with a display device such as a liquid crystal panel. The monitor 17 displays previously set prescribed items such as an operation instructing screen. In a lower part of the monitor 17, an operation panel 18 is provided in which the machine operator inputs an operation to a controller 27 (see FIG. 7). In the operation panel 18, are arranged operation buttons 18a for inputting various kinds of operations or an emergent stop button 18b.

In the component feed section 5, when the machine operator exchanges the carriage 8 or makes maintenance of the tape feeder 6, the machine operator operates the tape feeder 6 or the operation button 18a in accordance with an instruction of the operation instructing screen. Further, on upper covers of the device M1 to the device M5 respectively, signal towers 9 protrude (also see FIG. 1). Owing to a running out of component or an abnormal operation of a machine in each of the devices, when a treatment of the machine operator is necessary, the signal tower 9 turns on a signal lamp in a prescribed display pattern to inform the machine operator of the above-described situation.

Figure 4:
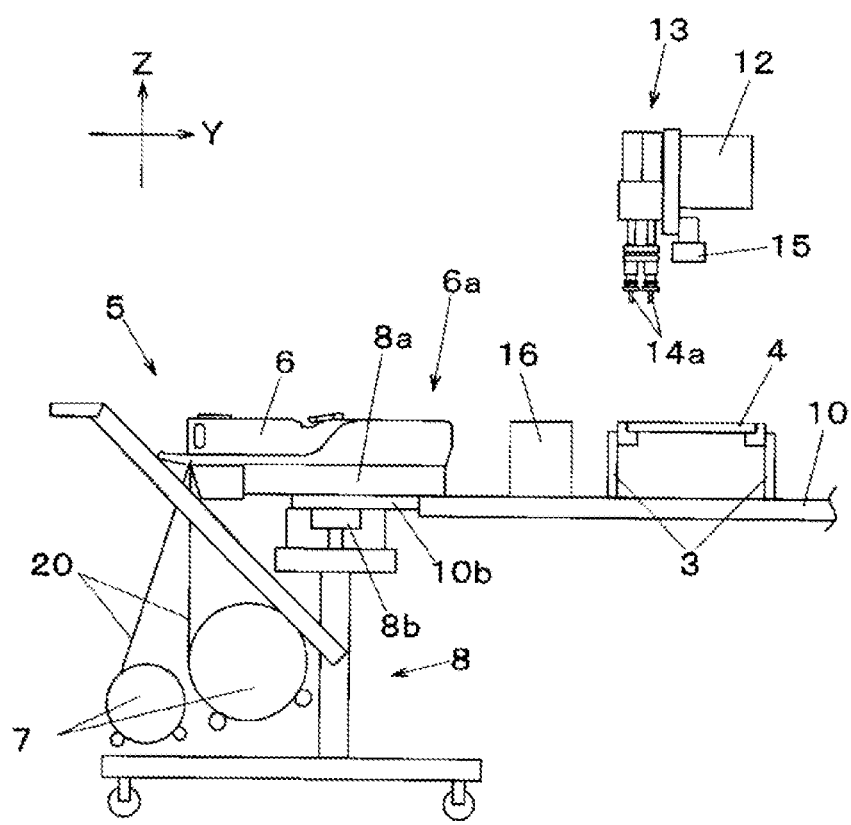
FIG. 4 is a partly sectional view of the electronic component mounting device of the one exemplary embodiment of the present invention.

As shown in FIG. 4, to the component feed section 5, the carriage 8 is set which has the plurality of tape feeders 6 previously attached to a feeder attaching base 8a. To a fixing base 10b provided in the base 10, the feeder attaching base 8a is clamped by a clamp mechanism 8b so that a position of the carriage 8 is fixed in the component feed section 5. In the carriage 8, the tape reels 7 are held which accommodate the carrier tapes 20 holding the electronic component in winding states. The carrier tapes 20 pulled out from the tape reels 7 are fed pitch by pitch to component suction positions 5a by the suction nozzles 14a by the tape feeders 6.

Now, referring to FIGS. 5A, 5B and 5C and FIGS. 6A and 6B, a structure and a function of the tape feeder 6 will be described below. As shown in FIG. 5C, the tape feeder 6 includes a feeder main body part 6a forming an entire configuration of the tape feeder 6 and an attaching part 6b which protrudes downward from a lower surface of the feeder main body part 6a. Under a state that tape feeder 6 is attached to the feeder attaching base 8a with the lower surface of the feeder main body part 6a extended along the feeder attaching base 8a, a connector provided in the attaching part 6b is fitted to the feeder attaching base 8a. Thus, the tape feeder 6 is fixed and attached to the component feed section 5. The tape feeder 6 is electrically connected to a controller 27 of each of the devices M1 to M5.

In the feeder main body part 6a, a tape travel path 6c opened to an upstream end part of the feeder main body part 6a in a tape feeding direction is provided to communicate with a suction position by the mounting head 13. The tape travel path 6c has a function for guiding a tape feed of the carrier tape 20 (see FIG. 5A) pulled out from the tape reel 7 and introduced to the feeder main body part 6a from the upstream side of the feeder main body part 6a to the suction position by the mounting head 13.

In the tape feed of the carrier tape 20 by the tape feeder 6, a tape splicing operation is carried out that a terminal end part of a carrier tape 20A which is already attached to the tape feeder 6 is joined to a leading end part of a new carrier tape 20B which is pulled out from a new tape reel 7 replaced due to the running out of component by using a connection tape. Thus, every time that the tape reel 7 is replaced by the new tape reel due to the running out of component, a joint part J is formed by joining the two carrier tapes 20 together, so that the carrier tape 20 is not interrupted and fed by the tape feeder 6.

Figure 5A:
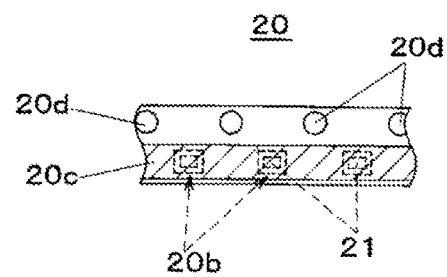
FIGS. 5A, 5B and 5C are explanatory views of a structure of a tape feeder attached to the electronic component mounting device of the one exemplary embodiment of the present invention.
Figure 5B:
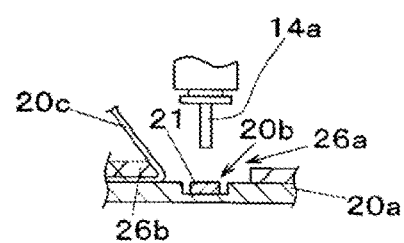
Figure 5C:
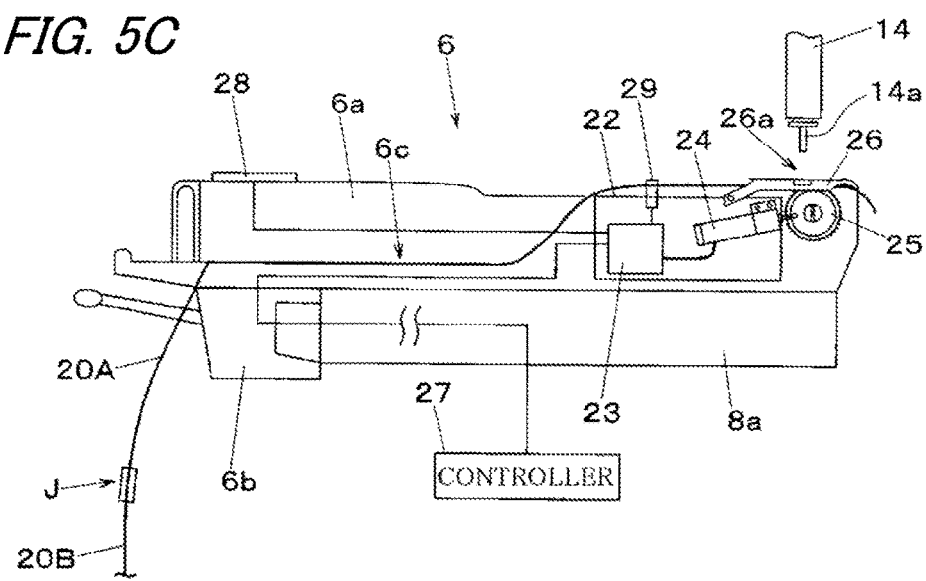

As shown in FIG. 5B, the carrier tape 20 includes, in a base tape 20a forming a tape main body, component pockets 20b which accommodate and hold the electronic component 21 and feed holes 20d provided at prescribed pitches for feeding the carrier tape 20 pitch by pitch. An upper part of the base tape 20a is sealed by a top tape 20c so as to cover the component pockets 20b in order to prevent the electronic component 21 from slipping out of the component pockets 20b.

In the feeder main body part 6a, a pitch feed mechanism 22 is built which feeds the carrier tape 20 pitch by pitch by a sprocket 25 arranged with an axis positioned horizontally in a downstream end part of the feeder main body part 6a in the tape feeding direction. The pitch feed mechanism 22 is provided with a tape feed motor 24 which rotates and drives the sprocket 25 and a feeder control part 23 which controls the tape feed motor 24. When the tape feed motor 24 is driven under a state that feed pins (an illustration is omitted) provided on an outer periphery of the sprocket 25 are engaged with the feed holes 20d (see FIG. 5A) of the carrier tape 20, the carrier tape 20 is fed pitch by pitch along the tape travel path 6c.

In a process of the pitch feed operation, when the carrier tape 20 passes a joint detecting part 29, the joint part J is detected by the joint detecting part 29 and a detected result is transmitted to the feeder control part 23. The joint detected result shows a lot of the electronic component fed by the tape feeder 6, namely, a switching timing of a group of component fed for a reel unit, and is not only recorded as component using history data, but also used as a trigger signal for resetting component remaining number data showing the number of component which can be fed by the tape reel 7 of the tape feeder 6.

A front side of the sprocket 25 is a suction position where the electronic component 21 in the component pocket 20b is sucked and taken out by the suction nozzle 14a of the unit mounting head 14. In an upper surface side of the feeder main body part 6a in the vicinity of the sprocket 25, a tape pressing member 26 is arranged. In the tape pressing member 26, a suction opening part 26a is provided correspondingly to the suction position by the suction nozzle 14a. In an upstream end of the suction opening part 26a, a top tape peeling part 26b is provided which peels the top tape 20c.

The carrier tape 20 is fed pitch by pitch under a state that the carrier tape is pressed to the tape travel path 6c by the tape pressing member 26. In a process that the carrier tape 20 travels below the tape pressing member 26, the top tape 20c is turned about the top tape peeling part 26b and pulled out to an upstream side. Thus, in the upstream side of the suction position, the top tape 20c is peeled from the base tape 20a. Thus, the electronic component 21 in the component pocket 20b (see FIG. 5B) is exposed upward in the suction opening part 26a so that the electronic component 21 may be taken out by the suction nozzle 14a. Then, the top tape 20c peeled from the base tape 20a and turned back in a tape peeling position is guided obliquely downward, which is opposite to a pitch feeding direction, and sent to a tape recovery part (an illustration is omitted) provided in the upstream side of the feeder main body part 6a by a top tape feed mechanism 6d (see FIG. 6B).

Figure 6A:
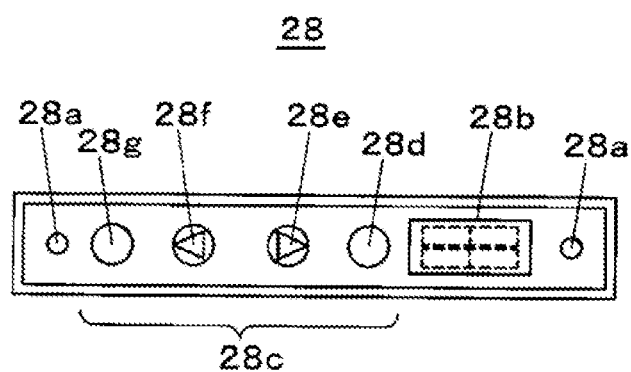
FIG. 6A is a plan view of an operating unit attached to the electronic component mounting device of the one exemplary embodiment of the present invention.
Figure 6B:
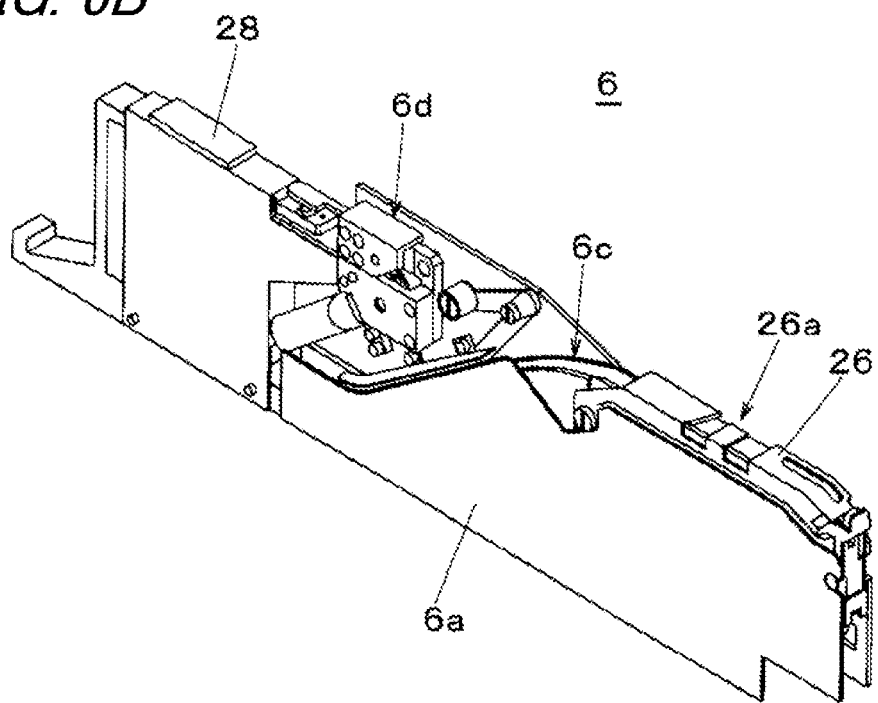
FIG. 6B is a perspective view of the tape feeder.

As shown in FIG. 6B, in the tape feeder 6, on an upper surface of a downstream side (a left side in the drawing) to which the operator comes near during an operation, an operation unit 28 is arranged which is operated by the operator or gives information to the operator. As shown in FIG. 6A, on an upper surface of the operation unit 28, below described display devices and operating devices are arranged as well as an LED lamp 28a showing an operating state. Initially, a display part 28b is a simplified display device which can display symbols such as numerical characters or alphabets of about two characters. Here, two display elements of a 7 segment type are combined together. The operation unit 28 is connected to the feeder control part 23 in the tape feeder 6, so that contents of a display are commanded through the feeder control part 23 by the controller 27 of each of the devices.

In the display part 28b, are displayed previously set and prescribed items which are necessary for monitoring the operation of the tape feeder 6 or maintenance of the tape feeder 6 and can be simply displayed by the symbols. In the present exemplary embodiment, in the display items, are displayed various kinds of parameters in carrying out a mounting operation, that is, information relating to a tape feeding operation by the tape feeder 6 and a component taking out operation from the tape feeder 6 by the mounting head 13 of the component mounting mechanism 40 as setting information which is previously set, input and stored.

In the operation unit 28, an operation input part 28c is provided together with the display part 28b. The operation input part 28c has functions for displaying the above-described setting information in the display part 28b, inputting a display operation for switching the displayed setting information and inputting a modification operation for modifying the displayed setting information as well as a function for inputting an operation for moving the tape feeder 6 by a manual operation.

In the present exemplary embodiment, the operation input part 28c includes a display switch button 28d, a tape feed button 28e, a tape return button 28f and a top tape winding button 28g. The display switch button 28d is an operation button which switches an ON/OFF operation of the display part 28b or the display items of the above-described displayed setting information. Namely, when the display switch button 28d is pressed under a non-display state of the display part 28b, the display part 28b is switched to a display state. After that, when the display switch button 28d is pressed in a previously set prescribed pattern, the display items of the setting information displayed in the display part 28b are switched. Every time the display switch button is pressed, a next display item is sequentially displayed in accordance with a previously set switching order.

Namely, in the present exemplary embodiment, the operation input part 28c is provided with the display switch button 28d which functions as a display switching button and serves as a display switching part which switches the setting information displayed in the display part 28b by operating the display switch button 28d by the operator.

The tape feed button 28e and the tape return button 28f are operation buttons which feed the carrier tape 20 in the tape feeder 6 by a manual operation. Namely, when the tape feed button 28e having an arrow mark attached in an advancing direction is operated, the carrier tape 20 can be fed in the advancing direction. When the tape return button 28f having an arrow mark attached in a retreating direction is operated, the carrier tape 20 can be fed in the retreating direction. The top tape winding button 28g is a manual operation button for winding the tap tape 20c. When the top tape winding button 28f is operated, the top tape 20c peeled from the base tape 20a in the tape peeling position is guided to the tape recovery part by the top tape feed mechanism 6d.

Further, the tape feed button 28e and the tape return button 28f are used as input buttons for modifying numerical data forming the above-described setting information. Namely, after the display item is selected by the display switch button 28d, the tape feed button 28e and the tape return button 28f are operated so that a modification operation for adjusting the numerical data may be carried out. A structure of the display part 28b or the operation input part 28c in the operation unit 28 is arbitrary and may be suitably selected in accordance with the kind of the setting information or a desired operability.

Figure 7:
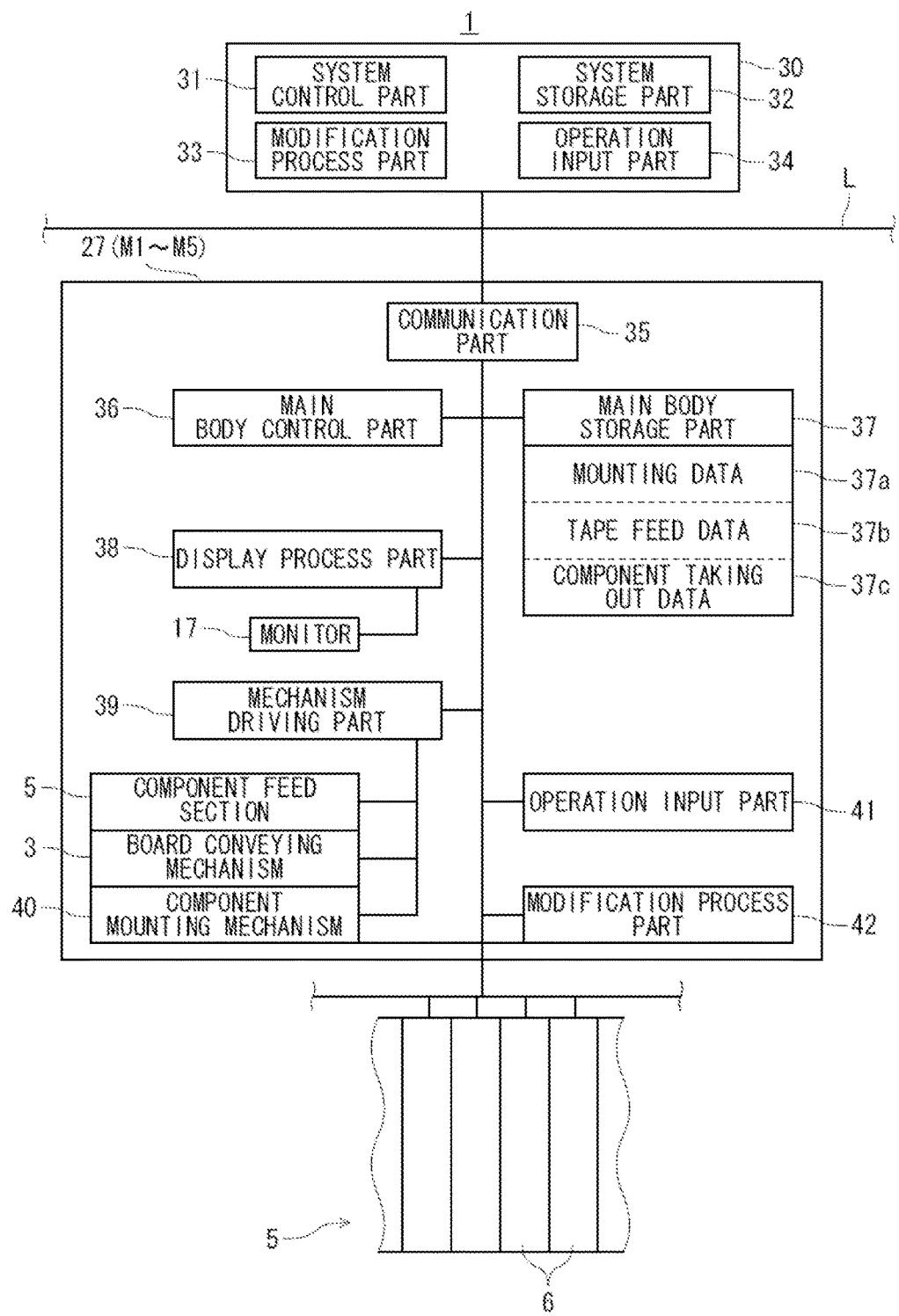
FIG. 7 is a block diagram showing a structure of a control system of the electronic component mounting device of the one exemplary embodiment of the present invention.

Now, referring to FIG. 7 and FIG. 8, a structure of a control system will be described below. FIG. 7 shows a control function provided in a management computer 30 and a function of the controller 27 provided in each of the devices M1 to M5. The management computer 30 includes a system control part 31, a system storage part 32, a modification process part 33 and an operation input part 34.

The system control part 31 controls an entire part of the electronic component mounting operation by the electronic component mounting system 1. The system storage part 32 stores data for a production operation such as processing programs necessary for the component mounting operation carried out by the electronic component mounting system 1 or mounting data of the various kinds of boards. The modification process part 33 carries out a process for modifying the data stored in the system storage part 32 such as the data for the production operation in accordance with an instruction input carried out through the operation input part 34.

The management computer 30 is connected to a communication part 35 provided in the controller 27 of the devices M1 to M5 through a LAN system L. The controller 27 includes a main body control part 36, a main body storage part 37, a display process part 38, a mechanism driving part 39, the component mounting mechanism 40, an operation input part 41 and a modification process part 42. Further, the devices M1 to M5 are respectively connected to the plurality of feeders 6 arranged in their component feed sections 5.

The main body control part 36 is a processing calculator to control below-described parts such as the component mounting mechanism 40 in accordance with various kinds of programs or data stored in the main body storage part 37. The main body storage part 37 stores information used in the control process by the main body control part 36. The information includes mounting data 37a, tape feed data 37b and component taking out data 37c as well as control process programs for carrying out the component mounting operation. The mounting data 37a is data which prescribes kinds of component to be mounted or component mounting positions and is stored for each of the kinds of the boards.

The tape feed data 37b is previously inputted as the setting information such as the operation parameters which prescribe the tape feeding operation by the tape feeder 6 or property data showing the property of the carrier tape as an object. Here, at least any one of a feed speed, a feed pitch and a material of the carrier tape 20 is included as the tape feed data. The component taking out data 37c shows the operation parameters such as a descending position or a descending height of the suction nozzle 14a when the electronic part is sucked and taken out from the tape feeder 6 by the suction nozzle 14a of the mounting head 13. The data is previously transmitted from the system storage part 32 of the management computer 30 to each of the devices as the setting information and stored in the main body storage part 37.

The display process part 38 carries out a process which allows the monitor 17 and the display part 28b to display prescribed items. The items displayed in the display part 28b include the above-described feed speed, the feed pitch and the tape material of the carrier tape 20. The mechanism driving part 39 is controlled by the main body control part 36 to drive the component feed section 5, the board conveying mechanism 3 and the component mounting mechanism 40. Thus, the component mounting operation is carried out that the electronic component taken out from the tape feeders 6 arranged in the component feed section 5 are moved and mounted on the board 4 held by the board conveying mechanism 3.

The operation input part 41 is an input device such as a keyboard or a touch panel provided in the monitor 17 and carries out an operation command for operating the device or an input operation when the already set setting information stored in the main body storage part 37 is modified. The modification process part 42 outputs a signal for modifying the setting information which is newly inputted through the operation input part 41 to the tape feeder 6 belonging to the device or other device and the management computer 30.

Now, referring to FIG. 8, a structure of a control system of the tape feeder 6 will be described below. As shown in FIG. 8, the tape feeder 6 includes the feeder control part 23 which controls the tape feeder and the above-described operation unit 28. Further, the feeder control part 23 includes a motor driving part 23a, a feeder storage part 23b and a modification process part 23c. In the operation unit 28, the operation input part 28c and the display part 28b are provided as described above. The motor driving part 23a drives the tape feed motor 24 which feeds the carrier tape 20 pitch by pitch. The feeder storage part 23b stores information used in a control process by the feeder control part 23.

The display part 28b displays the information relating to the tape feeding operation by the tape feeder 6 and the component taking out operation from the tape feeder 6 by the component mounting mechanism 40 as the setting information which is previously set and inputted and stored in the feeder storage part 23b. The operation input part 28c carries out an input of a display operation for displaying the setting information in the display part 28b and an input of a modification operation for modifying the displayed setting information. The modification process part 23c outputs a signal for modifying the setting information stored in the main body storage part 37 and the feeder storage part 23b in accordance with the input of the modification operation.

Figure 8:
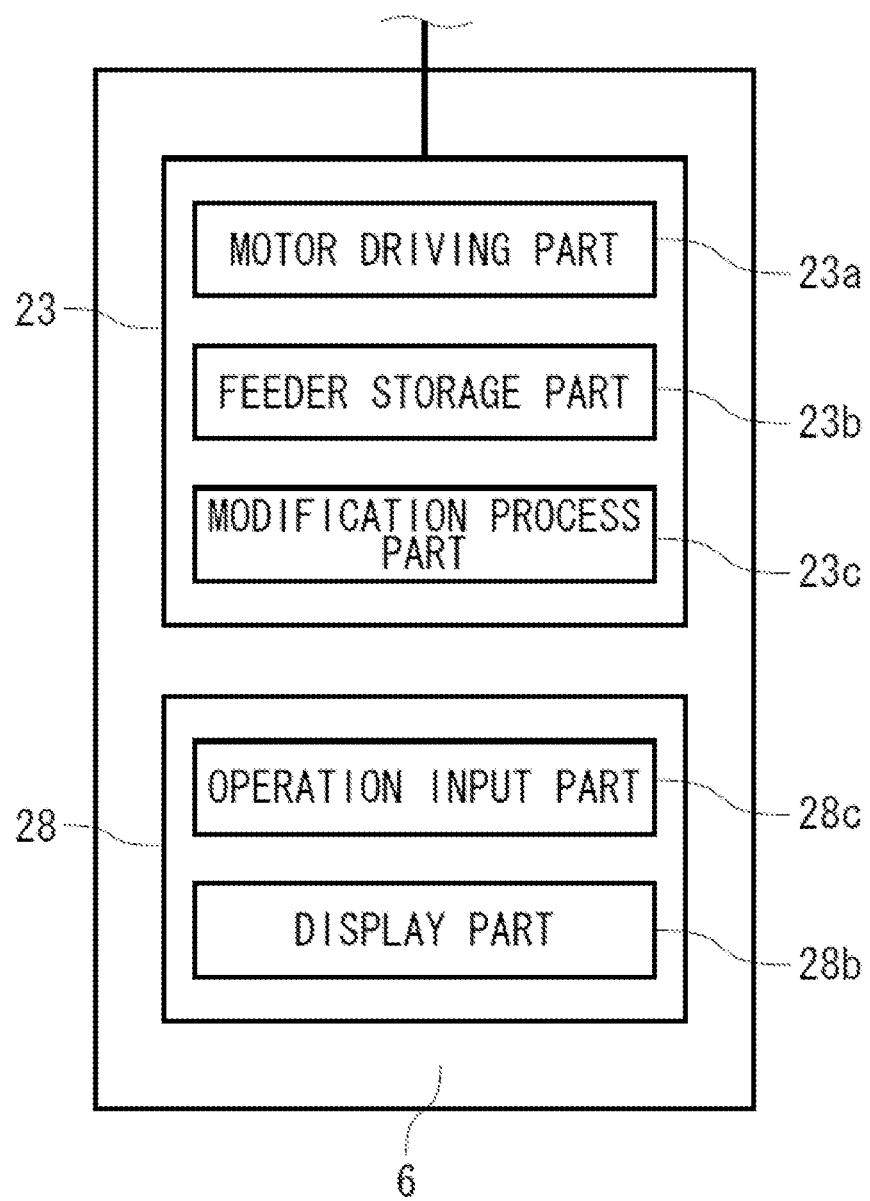
FIG. 8 is a block diagram showing a detailed structure of a control system of the tape feeder of the one exemplary embodiment of the present invention.

As shown in FIG. 7 and FIG. 8, in the electronic component mounting system 1, the system storage part 32 arranged in the management computer 30, the main body storage part 37 provided in each of the devices M1 to M5 and the feeder storage part 23b provided in each of the feeders 6 form a layered structure having the system storage part 32 set to the highest order. The layers respectively include the modification process part 33, the modification process part 42 and the modification process part 23c.

According to the structure, when the setting information is desired to be modified by setting the tape feeder 6 as an object of an input operation in each of the devices M1 to M5, may be selected any of the modification of the setting information by setting an entire part of the electronic component mounting system 1 as an object, only the device as an object or only the tape feeder 6 as an object. Namely, the modification process part 23c of the tape feeder 6 can set the system storage part 32, the main body storage part 37 and the feeder storage part 23b as the objects to selectively modify the setting information. It is to be understood that any of the management computer 30 or the devices M1 to M5 may be set as an object of an input operation to select the object for modifying the setting information in the same way.

In the devices M1 to M5 forming the electronic component mounting system 1, the modification of the setting information, which relates to the tape feeding operation by the tape feeder 6 and the component taking out operation from the tape feeder 6 by the component mounting mechanism 40 as the previously set and inputted setting information, is as follows. Initially, in the tape feeder 6, a display operation is inputted by the operation input part 28c to display the setting information stored in the feeder storage part 23b in the display part 28b arranged in the tape feeder 6 (a display process).

Figure 9A:
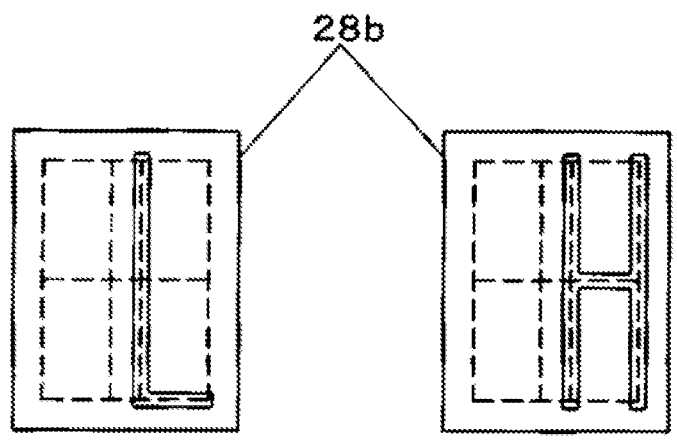
FIGS. 9A, 9B and 9C are explanatory views of a display part of the tape feeder in the electronic component mounting device of the one exemplary embodiment of the present invention.
Figure 9B:
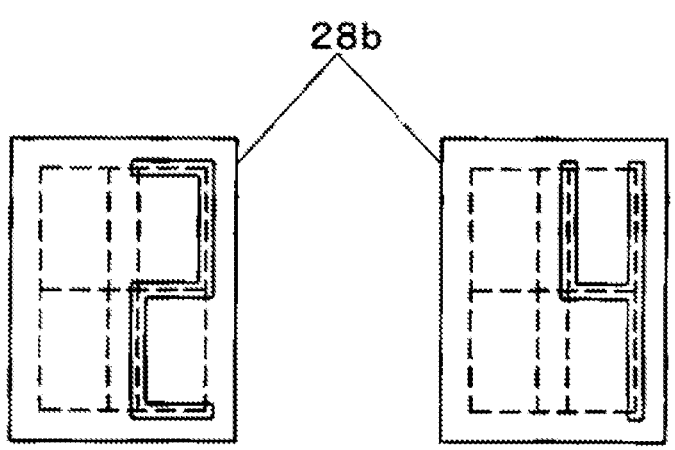
Figure 9C:
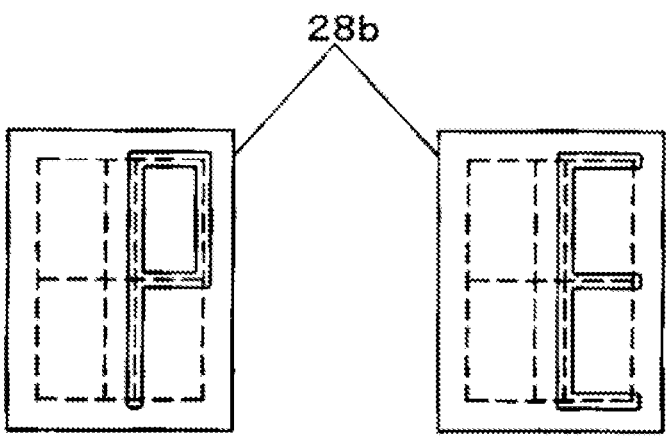

FIGS. 9A, 9B and 9C show examples of the setting information displayed in the display part 28b as described above. Here, the setting information includes the feed speed, the feed pitch and the tape material of the carrier tape 20. In FIGS. 9A, 9B and 9C, are displayed in the 7 segment type the characters, the symbols or the numerical characters respectively showing the feed speed, the feed pitch and the material of the tape. In a left side of FIG. 9A, an alphabet L showing that the feed speed is low is displayed. In a left side of FIG. 9B, the numerical character 2 showing the feed pitch is 2 mm is displayed. Further, in a left side of FIG. 9C, an alphabet P showing that the material of the tape is paper is displayed.

Then, the modification of the display is inputted by the operation input part 28c to output the signal for modifying the setting information from the modification process part 23c (a modification process). In the modification process, any of the system storage part 32 arranged in the management computer 30, the main body storage part 37 provided in each of the devices M1 to M5 and the feeder storage part 23b provided in each of the feeders 6 may be set as the object to selectively modify the setting information. Here, as shown in right sides of FIGS. 9A, 9B and 9C respectively, are displayed an alphabet H showing that the feed speed is modified to a high speed, the numerical character 4 showing that the feed pitch is modified from 2 mm to two times as long as 2 mm and an alphabet E showing that the material of the tape is a resin and embossed type.

When data is recognized or modified by setting other setting information as an object, the setting information displayed in the display part 28b is switched by the operation input part 28c having a function as the display switching part (a display switch process). After that, when the setting information needs to be modified, the same processes are repeatedly carried out.

As described above, in the electronic component mounting devices M1 to M5 and the tape feeders 6 shown in the present exemplary embodiment, each of the plurality of tape feeders 6 arranged in the component feed section 5 includes the display part 28b which displays the information relating to the tape feeding operation by the tape feeder 6 and the component taking out operation from the tape feeder 6 by the component mounting mechanism as the setting information which is previously set and inputted and stored in the feeder storage part 23b, the operation input part 28c which carries out an input of the display operation for displaying the setting information in the display part 28b and an input of the modification operation for modifying the displayed setting information and the modification process part 23c which outputs the signal for modifying the setting information stored in the main body storage part 37 and the feeder storage part 23b in accordance with the input of the modification operation. Thus, the display and the modification operation of the setting information can be carried out in a flexible form and with a good working property.

This application is based on Japanese Patent Application (JPA No. 2012-091576) filed on Apr. 13, 2012, and contents thereof are incorporated herein as a reference.

INDUSTRIAL APPLICABILITY

The electronic component mounting device and a method for modifying the setting information in the electronic component mounting device can effectively carry out the modification operation of the setting information such as tape feed data or component taking out data in the flexible form and with the good working property, and are available in the component mounting field that the component taken out from the tape feeder arranged in the component feed section is moved and mounted on the board.

DESCRIPTION OF REFERENCE NUMERALS AND SIGNS

1 . . . electronic component mounting system 2 . . . operation part 3 . . . board conveying mechanism 4 . . . board 5 . . . component feed section 6 . . . tape feeder 13 . . . mounting head 17 . . . monitor 20 . . . carrier tape 21 . . . electronic component 28 . . . operation unit 28b . . . display part 28c . . . operation input part 30 . . . management computer M1 to M5 . . . electronic component mounting device (device)

What is claimed is:

1. An electronic component mounting device having a component feed section to which a tape feeder is attached for feeding a carrier tape holding electronic components pitch by pitch to mount the electronic component on a board, the electronic component mounting device including:
　　a component mounting mechanism which takes out the electronic components from the tape feeder to move and mount the electronic components on the board;
　　a main body control part which controls the component mounting mechanism and
　　a main body storage part which stores information used in a control process by the main body control part, wherein
　　the tape feeder includes:
　　　　a feeder control part which controls the tape feeder,
　　　　a feeder storage part which stores information used in a control process by the feeder control part,
　　　　a display part which displays information relating to a tape feeding operation by the tape feeder and a component taking out operation from the tape feeder by the component mounting mechanism as setting information which is previously set and inputted and stored in the feeder storage part,
　　　　an operation input part which carries out an input of a display operation for displaying the setting information in the display part and an input of a modification operation for modifying the displayed setting information, and
　　　　a modification process part which outputs a signal for modifying the setting information stored in the main body storage part and the feeder storage part in accordance with the input of the modification operation.

2. The electronic component mounting device according to claim 1, wherein
　　the electronic component mounting device is connected to a plurality of the same kinds of electronic component mounting devices to form an electronic component mounting system,
　　a system storage part arranged in the electronic component mounting system, the main body storage part, and the feeder storage part form a hierarchy structure having the system storage part set to a highest level of the hierarchy structure, and
　　the modification process part is operative to set the system storage part, the main body storage part and the feeder storage part as objects to selectively modify the setting information.

3. The electronic component mounting device according to claim 1,
　　wherein the setting information includes at least any one of a feed speed, a feed pitch and a tape material of the carrier tape in the tape feeder.

4. A method for modifying setting information in an electronic component mounting device, including a component mounting mechanism which takes out an electronic component from a tape feeder to move and mount the electronic component on a board, a main body control part which controls the component mounting mechanism, and a main body storage part which stores information used in a control process by the main body control part, to take out the electronic component from a component feed section to which the tape feeder is attached for feeding a carrier tape holding the electronic component pitch by pitch and mount the electronic component on the board, the method for modifying setting information that modifies information relating to a tape feeding operation by the tape feeder and a component taking out operation from the tape feeder by the component mounting mechanism as previously set and inputted setting information includes:

a display process that a display operation is inputted by an operation input part in the tape feeder to display the setting information stored in a feeder storage part in a display part arranged in the tape feeder; and a modification process that a modification of a display is inputted by the operation input part to output a signal for modifying the setting information.

5. The method for modifying setting information in an electronic component mounting device according to claim 4, wherein the electronic component mounting device is connected to a plurality of the same kinds of electronic component mounting devices to form an electronic component mounting system, a system storage part arranged in the electronic component mounting system, the main body storage part, and the feeder storage part form a hierarchy structure having the system storage part set to a highest level of the hierarchy structure, and in the modification process, the system storage part, the main body storage part and the feeder storage part are set as objects to selectively modify the setting information.

6. The method for modifying setting information in an electronic component mounting device according to claim 4, wherein the setting information includes at least any one of a feed speed, a feed pitch and a tape material of the carrier tape in the tape feeder.

7. An electronic component mounting system comprising:
a system storage part; and
a plurality of electronic component mounting devices, each comprising:

a component feed section to which a tape feeder is attached for feeding a carrier tape holding electronic components pitch by pitch to mount the electronic component on a board;

a component mounting mechanism which takes out the electronic components from the tape feeder to move and mount the electronic components on the board;

a main body control part which controls the component mounting mechanism; and a main body storage part which stores information used in a control process by the main body control part, wherein the tape feeder includes:

a feeder control part which controls the tape feeder;

a feeder storage part which stores information used in a control process by the feeder control part;

a display part which displays information relating to a tape feeding operation by the tape feeder and a component taking out operation from the tape feeder by the component mounting mechanism as setting information which is previously set and inputted and stored in the feeder storage part;

an operation input part which carries out an input of a display operation for displaying the setting information in the display part and an input of a modification operation for modifying the displayed setting information; and a modification process part which outputs a signal for modifying the setting information stored in the main body storage part and the feeder storage part in accordance with the input of the modification operation, and wherein the modification process part is operative to set the system storage part, the main body storage part, and the feeder storage part as objects to selectively modify the setting information.

* * * * *